(12) United States Patent
Niedzwiecki (10) Patent No.: US 7,061,221 B2
(45) Date of Patent: Jun. 13, 2006

(54) REDUCED COMPLEXITY TRANSMISSION LINE AND WAVEGUIDE FAULT TESTER

(75) Inventor: Joshua D. Niedzwiecki, Manchester, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 11/035,311

(22) Filed: Jan. 13, 2005

(65) Prior Publication Data

US 2005/0156585 A1 Jul. 21, 2005

Related U.S. Application Data

(60) Provisional application No. 60/536,886, filed on Jan. 15, 2004, provisional application No. 60/536,977, filed on Jan. 15, 2004.

(51) Int. Cl.
*G01R 23/16* (2006.01)

(52) U.S. Cl. ............... 324/76.21; 324/646; 324/650

(58) Field of Classification Search ............... 324/638, 324/637, 76.21, 646, 650
See application file for complete search history.

(56) References Cited

U.S. PATENT DOCUMENTS

| 4,808,912 | A | * | 2/1989 | Potter et al. ............... 324/601 |
| 6,066,953 | A | * | 5/2000 | Wadell ...................... 324/601 |
| 6,636,048 | B1 | * | 10/2003 | Sciacero et al. ............ 324/520 |

* cited by examiner

*Primary Examiner*—Walter Benson
(74) *Attorney, Agent, or Firm*—Robert K. Tendler; Daniel J. Long (57) ABSTRACT

A four-port junction is substituted for a six-port junction in a frequency domain reflectometer, which reduces the parts count and therefore cost and size of the reflectometer while improving reliability. The frequency domain reflectometer can alternatively be used as an insertion loss tester. An algorithm including the Hilbert Transform is used to directly calculate the estimated reflection coefficient from the output power measured at only two output ports.

13 Claims, 7 Drawing Sheets

REDUCED COMPLEXITY TRANSMISSION LINE AND WAVEGUIDE FAULT TESTER

RELATED APPLICATIONS

This Application claims rights under 35 USC § 119(e) from U.S. Application Ser. No. 60/536,886 filed Jan. 15, 2004, and U.S. Patent Application Ser. No. 60/536,977 filed Jan. 15, 2004, the contents of which are incorporated herein by reference.

FIELD OF THE INVENTION

This invention relates to fault testers for transmission lines and waveguides and more particularly to a reduced complexity distance-to-fault frequency domain reflectometer that is used to estimate the locations and severity of multiple faults in a transmission line comprising either a waveguide or a cable.

BACKGROUND OF THE INVENTION

As noted in co-pending application Ser. No. 11/034,592, filed on even date herewith, by Taylor, et al. entitled "Method and Apparatus for Transmission Line and Waveguide Testing," assigned to the assignee hereof and incorporated herein by reference, it was found that a multi-port junction in the form of an RF circuit could be used to detect distance to faults and the severity of the faults by coupling selected outputs of the multi-port junction to an Inverse Fourier Transform, which converts frequency domain information to time domain information, thus to be able to determine the distance to a fault by a peak in the output of the transform output.

As detailed in the above patent application, assuming that one can generate an estimate of the complex reflection coefficient from the output of a multi-port junction, then several techniques are detailed that improve the accuracy of the calculated distance to fault and severity of fault. These include taking into account attenuation per unit length of transmission line and determining the effect of prior faults on the fault in question to eliminate the effects of multiple faults. Moreover, the ability to estimate a complex reflection coefficient, rather than using an absolute magnitude, results in the ability to reduce or eliminate so-called ghosts while at the same time permitting a ready calibration procedure that eliminates cumbersome in-field calibration.

The ability to accurately locate faults in a line is an extremely important capability that greatly reduces repair time in any application that requires the use of transmission lines or waveguides, particularly in military aircraft. These aircraft contain many different types and lengths of transmission lines and waveguides that are wired throughout the body. The performance of these lines is essential to the operation of the aircraft and the safety of the crew. Due to the complexity of the wiring, the ability to pinpoint the distance to the faults in the line, and subsequently, the exact location of the corresponding defected sections of cable in the aircraft, greatly reduce repair time. Based on the number of military aircraft currently in service, this reduction in repair time results in a great cost savings for the military and also means that more aircraft can be ready for deployment sooner, once a fault has been determined.

This device can also be used to measure the distance to faults in lines that are used in commercial applications. One commercial example is Community Antenna Television (CATV) distribution systems that route television signals over cable to multiple subscribers. Being able to easily and accurately locate faults in these types of transmission lines could greatly reduce repair time.

Some commercially available fault location systems are based on frequency domain reflectometry. These devices use sophisticated, expensive electronics such as network analyzers to measure the complex reflection coefficients of a transmission line over a set frequency range. They then use this complex frequency response to determine the locations of each fault in the line. Because of the need of an expensive network analyzer, these devices are bulky and very expensive.

The above-mentioned patent application discloses a system whereby an inexpensive multi-port junction can be used in conjunction with an Inverse Fourier Transform to replace network analysis. There, the multi-port junction used was a six-port junction, which involved analysis of the power available at four output ports. The power available at these four ports was used to estimate the aforementioned complex reflection coefficient. In so doing, it became evident that since, for instance, for a 50-MHz-to-18-GHz frequency domain reflectometer, one needed to break up or divide the frequency bands into five bands, then one required a separate six-port junction and separate power detectors for each of the five bands. Because of the number of components required for the five six-port junctions and the four power detectors per junction, such a reflectometer required 20 power detection circuits. Moreover, the six-port junction required five passive elements, namely four 90° quadrature hybrids and one power divider. In short, one needed 45 elements.

For a five-band instrument such as described above, size and cost is a large factor, and so while it was found that with a six-port junction one could obtain the requisite accuracy, it was important to be able to reduce the size and complexity as well as cost of such a multi-band reflectometer.

Noting that if one could reduce the number of components, one could reduce the size of the reflectometer, a large factor especially in military applications. Moreover, one could reduce production cost if one could obtain like results with fewer components. Also, with fewer components one could materially reduce material cost, which in turn reduces manufacturing cost as well as testing and analysis costs. Further, with a system with reduced numbers of components, the system itself is easier to repair and with fewer components one has fewer potential sources of error that could affect the product. Moreover, with fewer components there are fewer replacement parts later in the life cycle of the product.

Thus, for a five-band reflectometer going from 0.5–1 GHz, 1–2 GHz, 2-4 GHz, 4–8 GHz and 8–18 GHz, in order to cover the entire frequency region of interest requires five unique circuits are required that are designed and tuned to these different frequency ranges. It is noted that the multi-port junctions and the associated passive microwave components have a limited frequency band, with the bandwidth of the components being usually on the order of an octave. That is the reason that the operating range from 0.5 GHz to 18 GHz is divided up into five bands on the order of an octave.

It should be also noted that power detection circuits of reasonable cost are band-limited. Therefore it is impractical to switch one set of power detection circuits between the various frequency ranges. One can purchase broadband power detectors, but since the power detectors themselves are approximately 80% of the cost of the frequency domain reflectometer, any way to reduce the number of power detectors is advantageous.

If one were tempted to use a broadband power detector, regardless of cost, one would nonetheless require switching devices between the power detectors and each of the five multi-port junctions. The use of such a switching device increases size and degrades performance because as soon as one interposes a component between the power detector and the circuit, one has to calibrate out the characteristics of the component, namely the switching component. Thus the interposition of these types of switches adds to the complexity of the calibration and the modeling necessary in order to properly calibrate such a reflectometer.

Even if the effect of the interposition of the switches is calibrated out, the interposition of the switches would degrade the performance because there are losses in the switches such that some energy coming from the multi-port junction that is supposed to go directly into the power detector gets reflected and causes standing waves inside the multi-port junction.

The result is that trying to multiplex power detectors and multi-port junctions is complex, expensive and impractical.

There is therefore a need to provide a less complicated and less costly reflectometer.

SUMMARY OF THE INVENTION

Rather than using a six-port junction, in the subject device a four-port junction is used. It is a finding of the subject invention that one can use only two output ports, derive the power therefrom, and generate a satisfactory complex reflection coefficient. In so doing, one can reduce the number of power detection circuits per multi-port junction to two. This means that a five-band reflectometer cuts in half the number of power detection circuits.

Moreover, it has been found that one can obtain a suitable four-port device by utilizing, in one embodiment, only two passive components. These two components are 90° quadrature couplers and are interposed between the RF frequency source port and the cable-under-test port. Other four-port circuits include three passive components, again an advantage over the five-component six-port junction. Even with one four-point junction with five components, there is nonetheless a 50% reduction in the number of power detection circuits required.

Thus in the subject invention there are multiple realizations of the four-port circuit that at the very least result in a reduction in the number of power detection circuits required and in some cases a reduction in the number of passive components within the multi-port junction itself.

Not only is the number of components reduced by the ability to use the four-port junction in place of the six-port junction, there are fewer failures when utilizing a reduced number of circuit elements. Moreover, with the reduced number of circuit elements, the circuits are much better behaved. It is noted that the fewer microwave components one is designing into a circuit, the more stable the circuit will be when it is produced.

For instance, with a six-port reflectometer, if one is implementing it using an alumina substrate, a number of pieces of aluminum must be etched into the substrate. As is usually done, one produces a drawing for the six-port circuit and sends it out for fabrication so that a printed circuit can be etched onto the alumina substrate. Also, if one reduces the number of components in the circuit, the variability in the fabrication process becomes less apparent. This means that one is less affected by imperfections in the process because of the fact of having a simpler circuit.

One unique feature of the subject invention is that one can in fact estimate the complex reflection coefficient of the transmission line using only two power measurements. With a six-port junction, at each test frequency, there are four power measurements taken, each of which can be used to create a circle of unknown complex reflection coefficients in the complex plane. These four circles, when overlaid, yield only one common intersection between all of them. The complex value at this intersection unambiguously establishes the correct solution for the complex reflection coefficient. As detailed in the above patent application, algorithms are provided for estimating the complex reflection coefficient in which the four intersecting circles yield the correct solution.

However, when using only two power measurements, one can form only two circles. These two circles, when overlaid, can potentially intersect at two different complex values, therefore causing an ambiguity as to which is the true solution. As part of the subject invention, a signal processing technique is provided that allows one to determine which one of those two intersections results in the correct solution for the complex reflection coefficient at each frequency.

This is achieved by applying a constraint on the relationship between the real and imaginary components of the complex reflection coefficient profile across frequency. Current methods for estimating the complex reflection coefficient, as described in the above mentioned patent application, do not apply this constraint. Instead they calculate an independent complex reflection coefficient at each test frequency thus requiring at least three power measurements at each frequency to yield an unambiguous estimate for the actual complex reflection coefficient.

It is important to note that the actual RF components that make up the device under test and four-port circuit have a strict relationship between the real and imaginary components of their complex scattering parameters across frequency. This relationship based on the physics of the system is that for each scattering parameter, the frequency profile of the real and imaginary component are the same with a ninety degree phase shift between them.

If one employs this constraint when estimating the complex reflection coefficient for the device under test one can resolve the ambiguity between which intersection yields the correct estimate for the complex reflection coefficient at each frequency.

In practice this can be achieved by using the output power measurements from each A/D and combining those measurements to form a single data point for each test frequency that represents the sum of the real and imaginary component of the complex reflection coefficient scaled by the effects of the four-port circuit response and RF source power. When the data point for each test frequency is collected it is processed by the Hilbert Transform which outputs the complex reflection coefficient profile scaled by a complex gain at each test frequency that is a function of the four-port circuit response and the RF source power. This complex gain effect is removed by dividing the result at each frequency with the known complex gain that is calculated during calibration of the system. The output of this step is a complex reflection coefficient profile across frequency for the device under test. By using the Hilbert Transform, this complex reflection coefficient profile has the valid constraint that the real and imaginary components vary across frequency only by a 90 degree phase shift.

The uniqueness of the processing solution is that it was not immediately obvious that one could use only two power measurements, where the complex reflection coefficient could lie on a circle in the complex plane for each measurements, and resolve the ambiguity of which of the two circle two intersections yields the correct solution for the complex reflection coefficient. The subject system, instead of estimating the complex reflection coefficient independently at each frequency, actually computes the entire complex reflection coefficient frequency profile in one step by applying the constraint the real and imaginary component frequency profile only differ across frequency by a 90 degree phase shift. Using the Hilbert Transform one is able to easily apply this constraint which has the affect of resolving the ambiguity as to which intersection is the correct solution for the complex reflection coefficient at each frequency.

In terms of a reflectometer it is interesting to note that a four-port junction or circuit is one that accommodates a device under test at one port and an RF signal source at another port. The only other requirement of the four-port junction is that some of the energy from the RF source gets coupled to the unit under test and that some of that energy from the unit under test gets reflected back and is coupled to the two output ports of the four-port junction, along with some of the energy from the RF source. Thus the requirement is that energy from the signal source is coupled to a test port and energy from the signal source also is coupled to at least one of the two output ports along with energy reflected from the test port coupled to the two output ports.

For optimal performance, what one desires is that the phase relationship of the power measurements from the two output ports be 90° out of phase across frequency. For example, if one has a single fault on a cable under test, then the measured power out of one port may be a sinusoid, more particularly an exponentially decaying sinusoid. The optimal four-port junction would have the alternate output port being the same exponentially decaying sinusoid, but 90° out of phase with the initial one across frequency. At each frequency, the measurement at each port forms a circle in the complex plane where the true complex reflection coefficient could be. Using two port forms two intersecting circles. When the four-port is configured such that the output powers are 90° out of phase across frequency, the intersection of each of these circles is as close to perpendicular as possible. By making these circles as close to perpendicular as possible, the system becomes least sensitive to noise and inaccuracies in the calibration parameters of the system.

While it can be shown that close to optimal performance can be obtained by one or more of the embodiments of the subject four-port junction, when one seeks to reduce the number of passive components in the junction to only two microwave elements, while the size is greatly reduced, the phase relationship between the power measurements of both output ports is now 180° out of phase. Thus the intersection of the two respective circles is close to being tangent, such that the two circles are normal to each other. In this configuration the effects of noise and calibration parameters errors have a greater impact on performance. This is because smaller amounts of noise or calibration parameter errors can change the intersection of these circles by a large amount resulting in a larger error in the complex reflection coefficient estimate. In general if the calibration parameters errors and measurement noise are low the results will be sufficient. Therefore in applications when cost is the driving factor one could employ this embodiment and still achieve acceptable performance.

The result in the multiple embodiments to be described hereinafter is that the number of components can be drastically reduced per frequency band, with the above-mentioned advantages accruing.

Moreover, it has been found that a four-port reflectometer can be used without alteration as an insertion loss detector, by simply attaching different elements to different ports of the four-port circuit.

In summary, a four-port junction is substituted for a six-port junction in a frequency domain reflectometer, which reduces the parts count and therefore cost and size of the reflectometer while improving reliability. The frequency domain reflectometer can alternatively be used as an insertion loss tester. An algorithm including the Hilbert Transform is used to directly calculate the estimated reflection coefficient from the output power measured at only two output ports.

BRIEF DESCRIPTION OF THE DRAWINGS

These and other features of the subject invention will be better understood in connection with a Detailed Description, in conjunction with the Drawings, of which.

DETAILED DESCRIPTION

Figure 1:
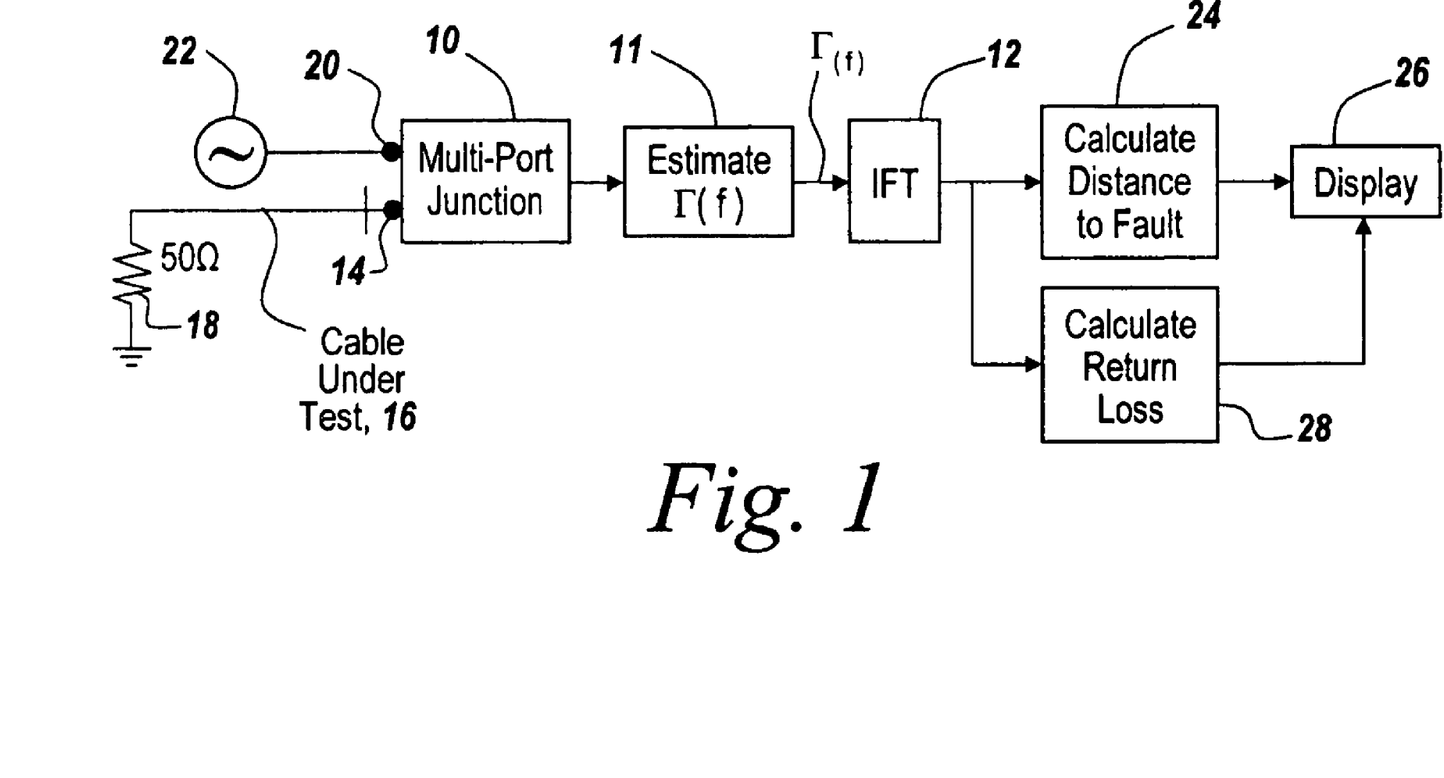
FIG. 1 is a block diagram of a frequency domain reflectometer in which a multi-port junction has outputs that are used to estimate the complex reflection coefficient coupled to an Inverse Fourier Transform to calculate distance to a fault and return loss from the fault for a transmission line under test.

As described in the aforementioned Taylor patent application, a multi-port junction 10 has outputs that are used to estimate the complex reflection coefficient at a module 11 of a transmission line or waveguide in which the complex reflection coefficient is coupled to an Inverse Fourier Transform 12 to convert frequency domain data to time domain data. The multi-port junction has a test port 14 to which a cable under test 16 is coupled, with the cable under test in one embodiment terminated by a 50-Ohm resistor 18. Multi-port junction 10 also has a signal port 20 to which a signal source 22 is coupled.

The result of the configuration of FIG. 1 is that it is possible, having estimated the complex reflection coefficient, to calculate the distance to a fault in the cable under test as illustrated at 24, and to calculate the return loss, the percent reflection or the severity of the fault as illustrated at 28, with both the calculated distance to the fault and the calculated return loss being displayed at a display 26.

Figure 2:
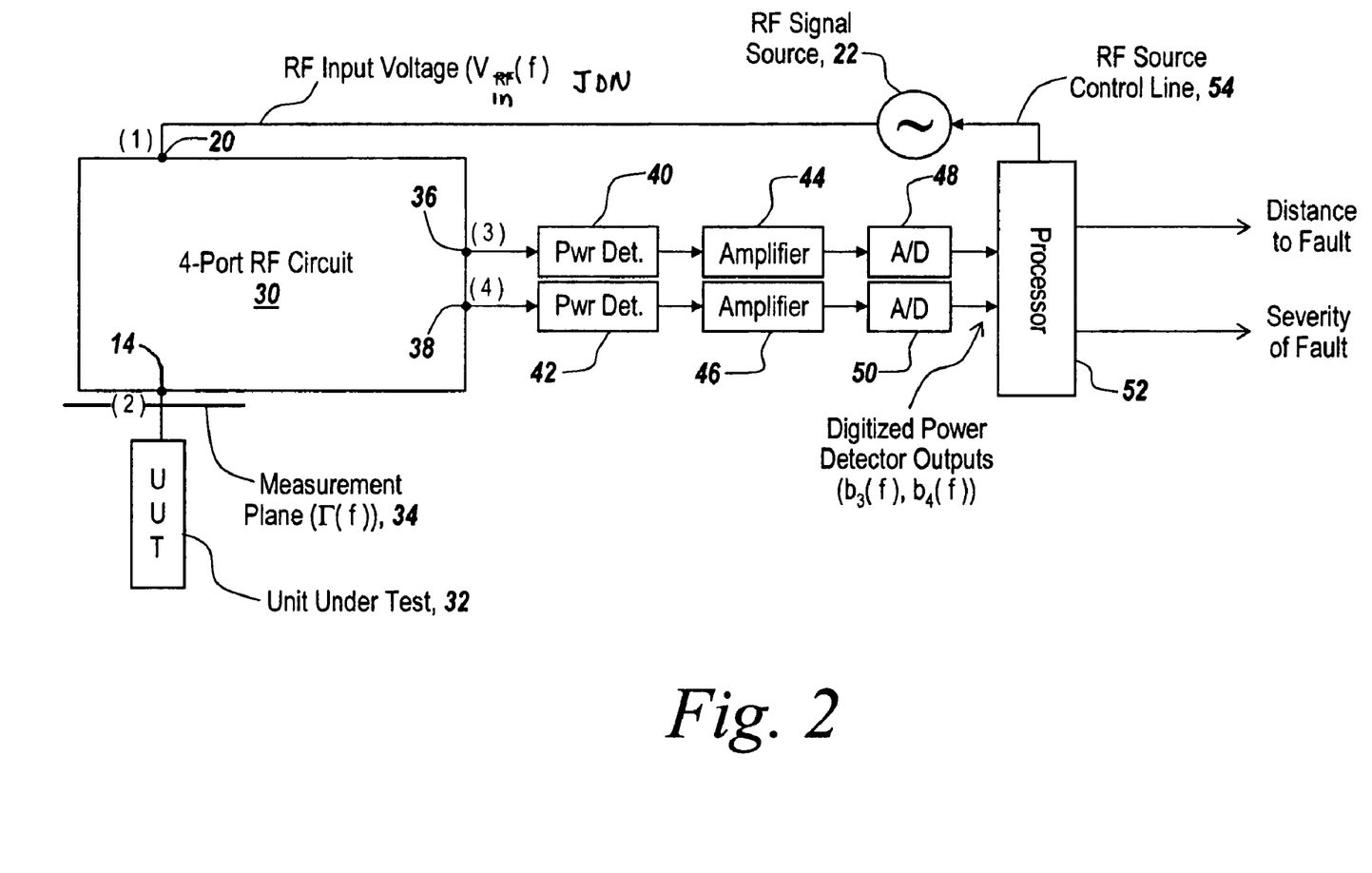
FIG. 2 is a block diagram of the system of FIG. 1 in which the multi-port junction of FIG. 1 comprises a four-port junction having one port connected to a signal source, a second port connected to a unit under test, and output ports connected to respective power detectors, amplifiers and analog-to-digital converters that provide an input to a processor for calculating distance to a fault and severity of the fault, thus implementing the system of FIG. 1.

Referring now to FIG. 2, while the system of FIG. 1 originally contemplated a six-port junction having four output ports from which the complex reflection coefficient would be estimated, in the subject invention a four-port junction or circuit 30 is used to provide power measurements from which to estimate the complex reflection coefficient from a unit under test 32 at a measurement plane 34. In order to do so, signal source 22 is coupled to signal port 20, whereas the unit under test is coupled to test port 14.

The output of the four-port circuit 30 is illustrated at 36 and 38, in which the reflected power from the unit under test is determined. The output ports 36 and 38 are coupled to respective power detectors 40 and 42, which are in turn coupled to respective amplifiers 44 and 46 and thence to respective analog-to-digital converters 48 and 50. The output of analog-to-digital converters 48 and 50 are the digitized power detector outputs in which the power is denoted by $b_3$ and $b_4$ as a function of frequency. With these digitized power detector outputs, a processor 52 processes the digitized power detector outputs and provides as an output the distance to a fault and the severity of the fault, such as described in connection with FIG. 1.

It is noted that processor 52 can control signal source 22 through a control line 54. It is further noted that the signal source output at signal port 20 is the input voltage ($V_{in}$(f)). What will be appreciated is that the frequency of the signal source can be varied in a controlled manner to sweep across the desired bands. Moreover, the power of the signal source can be controlled as well.

As noted hereinbefore, the four-port junction or circuit requires a signal port, and a test port for the device under test. The only other requirement of the four-port junction is that some of the energy from the signal source gets coupled to the unit under test and that some of that energy from the unit under test gets reflected back and is coupled to the two output ports of the four-port junction along with some of the energy from the signal source appearing in at least one of the two output ports for the four-port junction. Thus, energy from the signal source is coupled to a test port and energy from the signal source also is coupled to at least one of the two output ports along with energy reflected from the test port coupled to the two output ports.

It has been found that there are a number of instantiations of the four-port junction or circuit that provide the requisite output signals. Any one of the embodiments shown in FIGS. 3, 4 and 5 produce output power at the two output ports from which it is possible to estimate the complex reflection coefficient. It is noted that this complex reflection coefficient is then coupled to an Inverse Fourier Transform from which one can calculate the distance to a fault as well as the return loss or severity of the fault. Note that the techniques for doing so are contained in the co-pending Taylor patent application.

Figure 3A:
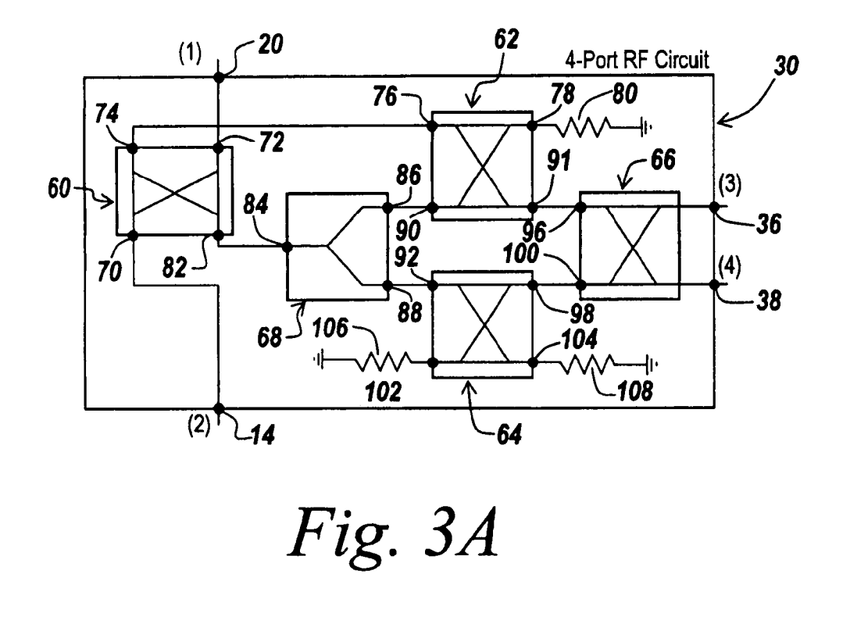
FIG. 3A is a circuit diagram of one embodiment of a four-port junction usable in the system of FIGS. 1 and 2, illustrating five passive components.

Referring now to FIG. 3A, in one embodiment of the four-port RF circuit 30 or junction, there are five passive elements. There are four 90° quadrature hybrids 60, 62, 64 and 66. Moreover, there is a 0° power divider 68.

Hybrid 60 has an input 70 connected to the test port 14 and a port 72, which is connected to signal port 20. The signal from signal port 20 passes through hybrid 60 from port 72 to port 70 and thence to the transmission line or device under test. Reflections from the transmission line under test go through hybrid 60 and are coupled out at port 74. Hybrid 60 is coupled to hybrid 62 by connecting port 74 to a port 76 on hybrid 60, which has a port 78 coupled to ground through a resistive load 80.

An output port 82 of hybrid 60 is coupled to an input port 84 of 0° power divider 68, which divides the input power at port 84 between output ports 86 and 88.

Output port 86 is coupled to input port 90 for hybrid 82, whereas output port 88 of hybrid 68 is coupled to input port 92 of hybrid 64. Output port 91 of hybrid 62 is coupled to input port 96 of hybrid 66, whereas output port 98 of hybrid 64 is coupled to input port 100 of hybrid 96. Ports 102 and 104 of hybrid 64 are coupled to respective matched resistors 106 and 108, which are in turn coupled to ground. The output of the four-port junction or circuit of FIG. 3A is available at output ports 36 and 38. In this embodiment the output powers are 90° out of phase across frequency.

In operation, energy from the RF source is coupled to port 20. From port 20, the energy is coupled to port 14 through hybrid 60. There is a 3-dB drop through the hybrid and a phase shift is imparted to the signal that goes out to the cable-under-test port 14.

One measures the reflection coefficient at port 14. To do this, the device under test or the cable under test is connected to port 14, and if there is an imperfect cable, some of that energy gets reflected back. Thus coming into port 14 is the reflected energy. This energy is also coupled to hybrid 60. From hybrid 60, that energy is coupled to hybrid 62. Once the energy is coupled to hybrid 62 from hybrid 60, i.e., from port 74 to port 76, the energy arrives at port 76. That energy from the cable under test arriving at port 76 is only energy that is a scaled version of the energy at port 14 that is reflected back.

Once the reflected energy is coupled to port 76, that energy is coupled to hybrid 66 because energy from port 76 is coupled to port 91. This energy is in turn coupled to port 96 of hybrid 66. This means that at port 96 of hybrid 66 one has an attenuated and phase-shifted version of the reflected energy at port 14.

What is important is that at port 96, the energy is coupled through 90° quadrature hybrid 66 to output port 36 and output port 38. Thus these signals are 90° out of phase from each other. What this explains is how the reflected energy is coupled to the output ports and how these outputs are 90° out of phase.

The next step is to show that there is also RF source energy from port 20 that is coupled through hybrid 60 out of port 82 and into port 84 of power divider 68. This power divider splits the power, with part of that energy coupled to hybrids 62 and 64. The energy at ports 90 and 92 will impart the same effect on the signal. Thus at port 91 and port 98, the parts of those signals that exist at these ports are just due to the RF source and are identical. This is important because port 91 is the point where the energy from the cable-under-test port gets summed with the energy from the RF source. Thus the energy at port 91 is actually the sum of the reflected energy and the RF source.

The second hybrid 64 is necessary because one does not have ideal components. If the components were ideal, one could merely put a pad between ports 92 and 98 so that the power due to the RF source would be the same at ports 92 and 98. Because the profile of an attenuator is different from a quadrature coupler across frequency, one needs a matched circuit in which between ports 92 and 98 almost the same thing is happening. The purpose of the hybrid is therefore to inject a portion of the RF signal source into the reflected energy from the cable under test.

Thus, the cable-under-test energy is coupled from port 96 to port 38, where the energy is mixed with the divided-down RF signal source from port 88 through port 92, through port 98 and thence to port 100, where the energy is mixed with the reflected component. It is also mixed with the reflected component at port 96 through hybrid 62.

The reason one has a mixture at port 96 and then another mixture at port 100 is because one wants a 45° phase shift between voltage measurements at ports 36 and 38 due to the RF source. This results in a 90° phase shift if one looks at the power at ports 36 and 38 across frequency.

The purpose of the above is that one has a 45° phase shift between the RF source voltages at ports 36 and 38 so that their powers are 90° out of phase. Thus when one looks at their power profile across frequency, the power measurements available at ports 36 and 38 are now 90° out of phase.

What will be appreciated with this circuit is that there are five passive hybrids or circuit elements that are used, and that there are two fewer power detectors required for each frequency band.

Figure 3B:
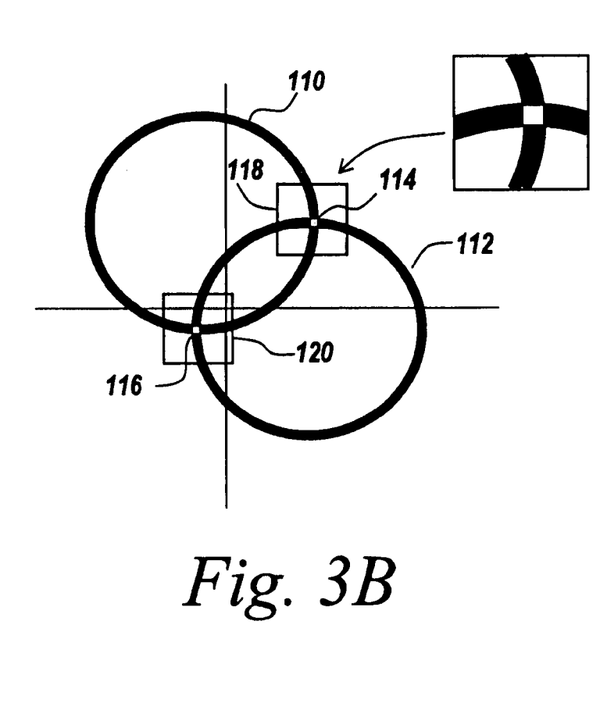
FIG. 3B is a graph of real versus imaginary reflection coefficients, showing the locus of solutions for the estimation of the reflection coefficient using the FIG. 3A circuit.

The result of using the circuit can be characterized as illustrated in FIG. 3B in which circles 110 and 112 define the locus of complex reflection coefficient solutions. It is noted that these two circles intersect each other to form a Γ intersect. This intersection is at right angles at points 114 and 116 because the circles are normal to each other. Thus, the area of uncertainty at each of the points due to noise as illustrated at 118 and 120 is relatively small due to the right-angle crossing.

Figure 4A:
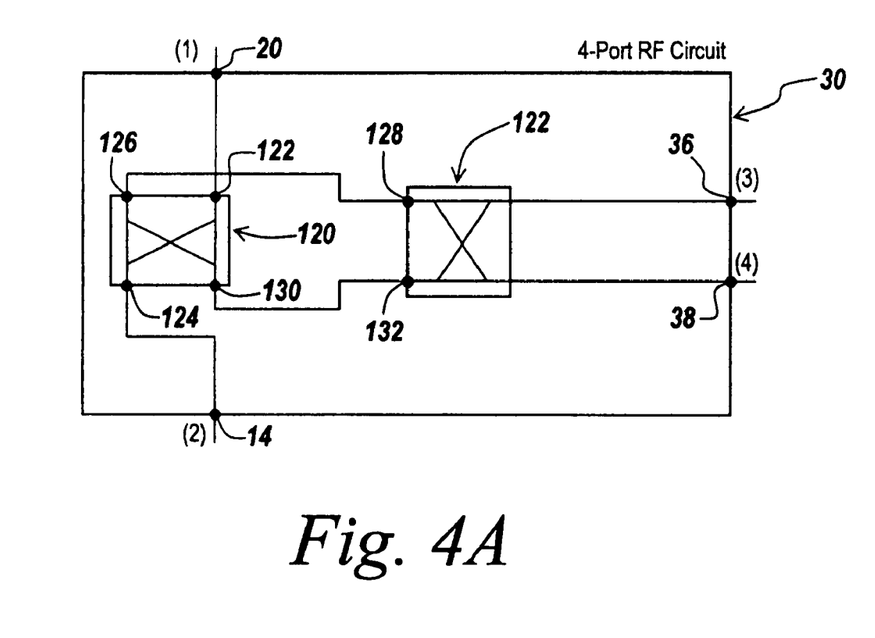
FIG. 4A is another embodiment of the four-port junction of FIGS. 1 and 2 in which only two passive components are used.

Referring now to FIG. 4A, in another embodiment of the four-port RF circuit or junction 30, one uses two 90° quadrature hybrids 120 and 122. Note that the size of the four-port junction is greatly reduced using only two passive components. Here port 122 is coupled to signal port 20, whereas port 124 is coupled to test port 14.

Hybrid 120 has an output port 126 coupled to an input port 128 of hybrid 122, whereas an output port 130 of hybrid 120 is coupled to an input port 132 of hybrid 122. The output ports 36 and 38 are as noted. Here the output powers are 180° out of phase across frequency.

In operation, in this particular configuration, the energy coming from the RF source that is coupled to port 20 is coupled through the same quadrature coupler, hybrid 120, out to the cable-under-test port, 14. Some of the energy injected into the cable under test gets reflected from the cable under test and goes back into that same quadrature coupler, hybrid 120. Thereafter and a portion of that energy is coupled out of port 126 into port 128. Then at port 128, which is the input to quadrature coupler 122, that energy gets attenuated and phase shifted by 90° so that the outputs at ports 36 and 38 are voltages that are due to the reflected energy and are 90° out of phase from each other across frequency.

The same thing happens to the energy coming from the RF source. Some energy from the RF source at port 20, when it goes through quadrature coupler hybrid 120 having entered at port 122 comes out at port 130. Thus some of the RF source energy is directly coupled to port 38. Note this RF source energy also passes through hybrid 122. One can see, energy coming out of port 130 is just energy from the RF source at port 20. This RF source energy coming out of port 130 is coupled to port 132 through hybrid 122 to ports 36 and 38 as RF source voltages that are now 90° out of phase from each other. Thus at ports 36 and 38, one ends up with the sum of the RF source voltages and the cable-under-test voltages that are 90° out of phase from each other. When one converts to power, the power measurements are 180° out of phase from each other across frequency.

It will be seen that the embodiment of FIG. 4A is comprised of only two passive elements and therefore is exceedingly inexpensive to manufacture and is exceedingly reliable. Here one has removed three components per band; and with a five-band system one has removed 15 components plus ten power detectors.

Figure 4B:
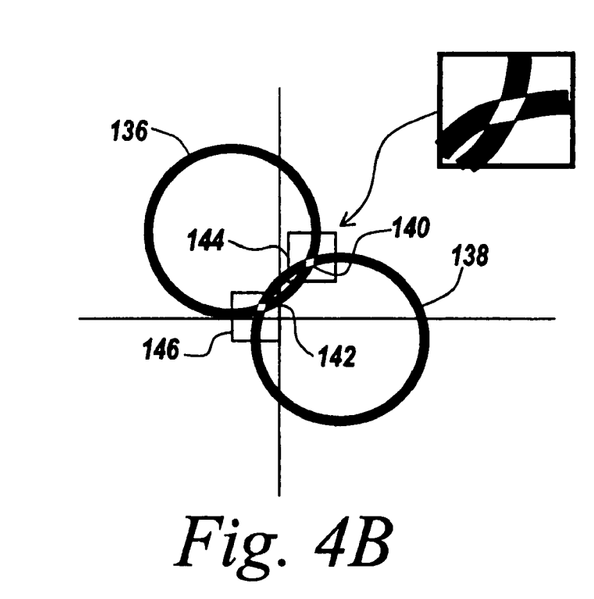
FIG. 4B is a graph of real versus imaginary reflection coefficients, showing the locus of solutions for the estimation of the reflection coefficient using the FIG. 4A circuit.

Referring to FIG. 4B, since the outputs are 90° out of phase, the circles 136 and 138 defining a locus on which the complex reflection characteristic solutions will lie cross at points 140 and 142. Here it will be seen that the circles 136 and 138 tangentially touch each other. This makes the areas of uncertainty 144 and 146 due to noise diamond-shaped. These diamond-shaped areas of uncertainty in general are of larger size than the square-shaped areas of uncertainty 116 and 118 of FIG. 3B. It has been found that since detector noise can be kept low, while the areas of uncertainty in the FIG. 4A embodiment of the four-port junction are larger than those associated with the four-port junction of FIG. 3A due to the almost-tangency of the intersection of the circles, it is nonetheless possible to use the four-port circuit of FIG. 4A to estimate the complex reflection coefficient with sufficient reliability.

Figure 5A:
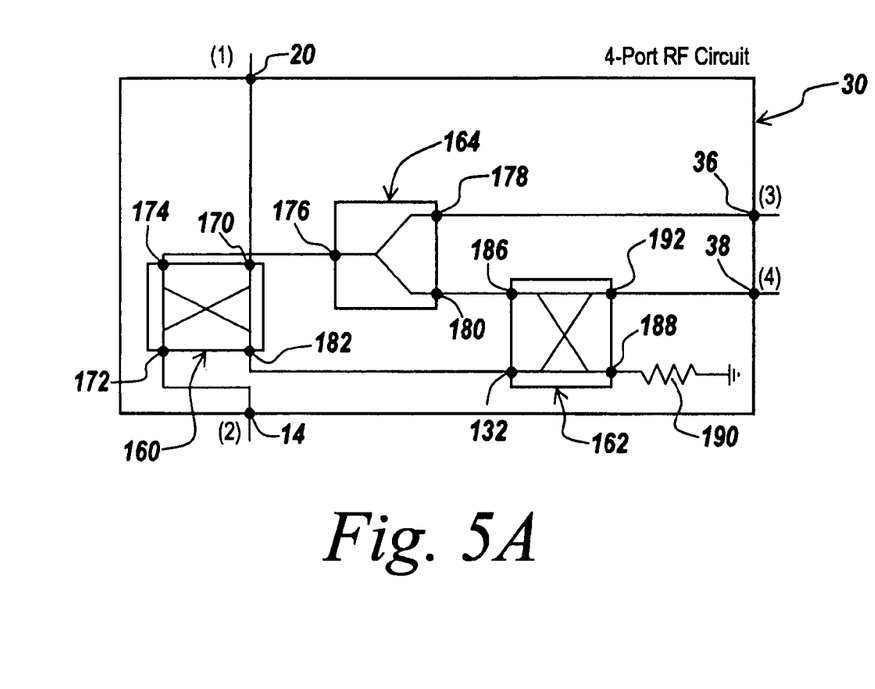
FIG. 5A is a further alternative embodiment of the four-port junction of FIGS. 1 and 2, illustrating a three-element embodiment.

Referring now to FIG. 5A, in a still further embodiment of the four-port circuit or junction 30, a three-element circuit can be devised that includes two 90° quadrature hybrids 160 and 162, and a 0° power divider circuit 164. Here, one of the output ports carries power that is only a function of reflected energy from the transmission line under test. There is no direct path that couples energy from the signal source to this output port.

In this embodiment, hybrid 160 has an input port 170 coupled to the signal port 20 and an input port 172 coupled to the cable-under-test port 14. Hybrid 160 has an output port 174 coupled to the input port 176 of power divider 164, which has the divided power distributed between output ports 178 and 180. It is noted that output port 178 corresponds to output port 36 for the four-port circuit.

Hybrid 160 also has an output port 182 coupled to an input port 132 of hybrid 162, which also has an input port 186 coupled to output port 180 of the power divider. Hybrid 162 has an output port 188 coupled to ground through a matched resistive termination 190 and has an output port 192, which forms the output 38 for the four-port circuit.

In operation, in this configuration the RF source energy from port 20 is coupled through quadrature coupler hybrid 160, with some of the energy getting coupled out to port 14, the cable-under-test port. Some of that energy gets reflected back and goes into port 172 of quadrature coupler hybrid 160 and gets coupled out to port 176 of power divider 164. Once the energy is at port 176, that power is split and some of that power is directly coupled to output port 36. The other portion is coupled to port 186 of hybrid 162. It will be appreciated that the signal out of port 36 is only a function of the reflected energy from the cable-under-test port. It is not a function of the RF source energy.

Going back to port 176, some of the other reflected energy goes from port 180 to port 186 and passes through quadrature coupler hybrid 162, where it gets attenuated and is coupled to port 38. This is how the reflected energy gets to the output ports.

Note, the energy coming directly from port 20 also gets coupled to the output port 38 through hybrid 160. This RF source energy is coupled into port 170, out of port 182 and into port 132 of hybrid 162. Port 132 is the input to hybrid 162 that combines the reflected energy at ports 180 and 186 and combines that energy with the RF source energy.

Thus the output at port 192 is the sum of a phase-shifted version of the reflected energy and a phase-shifted version of the input RF source energy. This port is coupled to output port 38. What is important is that port 38 contains the sum of the RF source energy and the reflected energy from the cable under test. However, port 36 contains only the reflected energy.

Figure 5B:
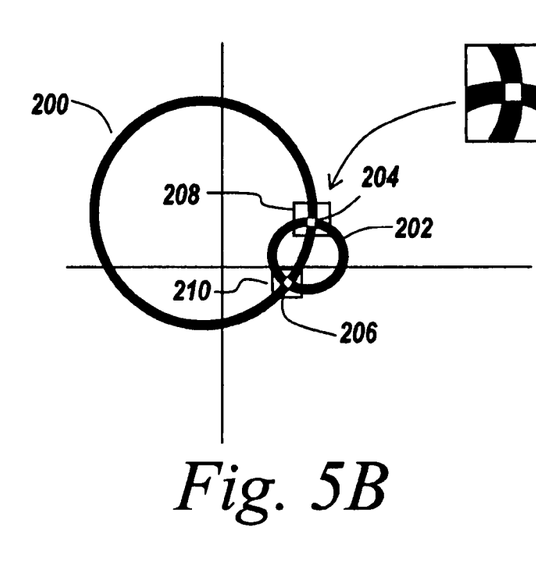
FIG. 5B is a graph of real versus imaginary reflection coefficients, showing the locus of solutions for the estimation of the reflection coefficient using the FIG. 5A circuit.

Referring to FIG. 5B, the circles defining the locus of the solutions for the complex reflection coefficient, here illustrated at 200 and 202, intersect at points 204 and 206 as illustrated. There are areas of uncertainty 208 and 210 that are comparable to the areas of uncertainty in the FIGS. 3A and 3B embodiment.

Here, however, the size of circle 202 indicates that in terms of the power detector circuitry, one would have to have a fairly large dynamic range for the detectors because one has only three components. This makes the size and cost reduction from the original four-port design more attractive. The performance problem is that the power at port 36 has a much wider dynamic range. This is because there is no bias from the RF source at port 36, which can range from 0 to 1. Thus, the dynamic range of the power detector required needs to be larger. In one embodiment, the dynamic range of the log detector used for the power detection is on the order of 50–60 dB.

If one were to choose a diode or log detector for Port 36 that has a narrower range, what happens is that one becomes less accurate for faults that are very close in. What occurs for these close-in faults is that clipping occurs, so that faults having a high reflection coefficient will be clipped. Note that faults that are far away are unaffected.

For all of the four-port circuits, as noted above, Equation 1 is used to estimate the complex reflection coefficient.

It is noted that in the above equation, the complex reflection coefficient is a function of the power measurements, the gain and offset used that were determined during calibration, and the scattering parameters of the calibration loads and those of the multi-port, four-port junction that were measured at the factory.

In this particular embodiment, the S parameters S-31 that define the transfer function between the Port 1 and Port 3, i.e., the ports 20 and 36 respectively, happens to be close to zero. The fact that it is not zero does not cause the algorithm to change. This is why the particular estimation algorithm of Equation 1 is very flexible. It will work with any four-port circuit and it is just a matter of trade-offs between components, size and cost versus performance characteristics that determine which circuit to use.

It is noted that circle 200 is a result of the power at Port 3 or, in this case, port 36, which is not a function of the RF source power. It thus forms a much larger circle, meaning that it requires a much larger dynamic range power detector.

It is further noted that the circuit of FIG. 5A has a noise immunity similar to the circuit of FIG. 4A but has one more circuit element.

However, with low noise detectors with sufficiently wide dynamic range, the operation of all of the above four-port circuits is virtually identical to the operation of the six-port circuit described in the above-mentioned Taylor patent application.

A further description of the function of the four-port circuit is now presented.

Four Port Detailed Algorithm Description:

With the four-port RF circuit one obtains only two power measurements at each test frequency. These two power measurements each form a circle in the complex plane where the true complex reflection coefficient could be. These two circles, when overlaid, can potentially intersect at two different complex values, therefore causing an ambiguity as to which is the true solution. As part of the subject invention, a signal processing technique is provided that allows one to determine which one of those two intersections results in the correct solution for the complex reflection coefficient at each frequency.

This is achieved by applying a constraint on the relationship between the real and imaginary components of the complex reflection coefficient profile across frequency. Current methods for estimating the complex reflection coefficient, as described in the above mentioned patent application, do not apply this constraint. Instead they calculate an independent complex reflection coefficient at each test frequency thus requiring at least three power measurements at each frequency to yield an unambiguous estimate for the actual complex reflection coefficient.

It is important to note that the actual RF components that make up the device under test and four-port circuit have a strict relationship between the real and imaginary components of their complex scattering parameters across frequency. This relationship based on the physics of the system is that for each scattering parameter, the frequency profile of the real and imaginary component are the same with a ninety degree phase shift between them.

If one employs this constraint when estimating the complex reflection coefficient for the device under test one can resolve the previously stated ambiguity.

In practice this can be achieved using the Hilbert Transform which applies this same constraint. Using the Hilbert Transform, the complex reflection coefficient at each test frequency is estimated in one step as follows:

$$\hat{\Gamma}(f) = \frac{H\{y(f)\}}{D(f)} \tag{0.01}$$

where $H\{\ \}$ denotes the Hilbert Transform and is applied once to the entire set of data $y(f)$ for all measured frequencies "f". It is important to note that $y(f)$ is generated using the measurements taken at the output of the detection circuitry measured by the A/D for each port, the scattering parameters of the four-port circuit, the nominal source power of the RF source and the gains and offsets due to the RF source power variation and detection circuitry gain and offset variation. $D(f)$ is a function of the scattering parameters of the four-port circuit and the nominal RF source power.

The value for $y(f)$ at each frequency is computed differently depending on whether square law or log power detectors are employed in the detection circuitry. If square law detectors are used $y(f)$ is computed as follows:

$$y(f) = \frac{b_3(f) - (g_3(f) \cdot \delta_3(f) + a_3)}{g_3(f)\alpha_3(f)} - \frac{b_4(f) - (g_4(f) \cdot \delta_4(f) + a_4)}{g_4(f)\alpha_4(f)} \quad (0.02)$$

If log detectors are employed y(f) is computed as follows:

$$y(f) = \frac{10^{\left(\left(\frac{b_3(f)-a_3(f)}{10g_3(f)}\right)-3\right)} - \delta_3(f)}{\alpha_3(f)} - \frac{10^{\left(\left(\frac{b_4(f)-a_4(f)}{10g_4(f)}\right)-3\right)} - \delta_4(f)}{\alpha_4(f)} \quad (0.03)$$

The value for D(f) is a function of the scattering parameters of the four-port circuit and the nominal RF source power and is computed as follows $$D(f) = \left(\frac{\beta_3(f)}{\alpha_3(f)} - \frac{\beta_4(f)}{\alpha_4(f)}\right) - j\left(\frac{\gamma_3(f)}{\alpha_3(f)} - \frac{\gamma_4(f)}{\alpha_4(f)}\right) \quad (0.04)$$

In Equation 0.02–0.03, $b_n(f)$ denotes the A/D measurements taken at the output of the detection circuitry from port "n" at frequency "f".

In these same equations $g_n(f)$ and $a_n(f)$ denote the gains and offsets respectively, estimated during field calibration for each port "n" and each frequency "f". These gains and offsets compensate for variations in the RF source power across frequency and variability in the gains and offsets inherent in the detection circuitry including the power detectors, amplifiers and A/D converters.

In Equations 0.02–0.04, $\alpha_n(f)$, $\beta_n(f)$, $\gamma_n(f)$ and $\delta_n(f)$ are known parameters that are functions of the complex scattering parameters $s_{nm}(f)$ of the multi-port circuit and are also functions of the nominal RF source power $P_s$. These relationships are defined as follows:

$$\alpha_n(f) = P_s \cdot |s_{21}(f)s_{n2}(f)|^2 \quad (0.05)$$

$$\beta_n(f) = P_s \cdot 2[\text{Re}\{s_{21}(f)s_{n2}(f)\}\text{Re}\{s_{n1}(f)\} + \text{Im}\{s_{21}(f)s_{n2}(f)\}\text{Im}\{s_{n1}(f)\}] \quad (0.06)$$

$$\gamma_n(f) = P_s \cdot 2[\text{Re}\{s_{21}(f)s_{n2}(f)\}\text{Im}\{s_{n1}(f)\} - \text{Im}\{s_{21}(f)s_{n2}(f)\}\text{Re}\{s_{n1}(f)\}] \quad (0.07)$$

$$\delta_n(f) = P_s \cdot |s_{n1}(f)|^2 \quad (0.08)$$

Note that Re{ } and Im{ } denote the real and imaginary component respectively.

It is important to note that this approach differs significantly from conventional approaches for estimating the complex reflection coefficient when, for example a six-port RF circuit is employed. When using a six-port circuit one has four output power measurements for each frequency that can be used to unambiguously determine the complex reflection coefficient. In this approach the complex reflection coefficient is calculated independently for each frequency. The solution given in Equation 0.01 for use with a four-port circuit on the other hand, uses the Hilbert Transform to compute the complex reflection coefficient across all frequencies in one step. This is necessary when using a four-port circuit because at each frequency the value for the complex reflection coefficient could be one of two values. To remove this ambiguity we use the Hilbert Transform to apply a constraint across frequency that the real and imaginary component of the complex reflection coefficient profile have the same profile with a ninety degree phase shift between them. This constraint is valid because the components that make up the transmission line under test and the four-port circuit also follow the same physical principle. Therefore, by applying this technique one removes the ambiguity at each frequency and can correctly estimate the complex reflection coefficient profile.

For clarification of the steps performed in 0.01–0.04 we can define the signal model for the A/D output measurements as a function of the unknown complex reflection coefficient as follows:

If square law detector are employed the signal model is $$b_n(f,\Gamma(f)) = g_n(f) \cdot (\alpha_n(f)|\Gamma(f)|^2 + \beta_n(f)\text{Re}\{\Gamma(f)\} + \gamma_n(f)\text{Im}\{\Gamma(f)\} + \delta_n(f)) + a_n(f) \quad (0.09)$$

If log detector are employed the signal model is $$b_n(f,\Gamma(f)) = g_n(f) \cdot \text{LOG}_{10}(\alpha_n(f)|\Gamma(f)|^2 + \beta_n(f)\text{Re}\{\Gamma(f)\} + \gamma_n(f)\text{Im}\{\Gamma(f)\} + \delta_n(f)) + a_n(f) \quad (0.10)$$

Note that both models are functions of the scattering parameters of the four-port RF circuit as measured during the factory calibration process, the nominal RF source power, standard component models for the detector circuitry and the gains and offsets due to RF source power and detector circuitry variation.

Using the signal models described in Equation 0.09 and 0.10 in place of the measurements $b_n(f)$ in Equations 0.02 and 0.03 respectively, one can define a model for y(f) denoted $\hat{y}(f)$.

$$\hat{y}(f) = \text{Re}\left\{\left(\left(\frac{\beta_3(f)}{\alpha_3(f)} - \frac{\beta_4(f)}{\alpha_4(f)}\right) - j\left(\frac{\gamma_3(f)}{\alpha_3(f)} - \frac{\gamma_4(f)}{\alpha_4(f)}\right)\right)\Gamma(f)\right\} \quad (0.11)$$

Substituting Equation 0.04 into 0.11 yields $$\hat{y}(f) = \text{Re}\{D(f)\Gamma(f)\} \quad (0.12)$$

Thus by applying the Hilbert Transform to y(f) and then dividing by D(f) as shown in Equation 0.01 one obtains an estimate for the complex reflection coefficient $\Gamma(f)$ for the transmission line under test at each frequency.

The result is that the process allows one to obtain the complex reflection coefficient of the device under test at each test frequency unambiguously by employing the process described in Equation 1, which employs the Hilbert Transform.

Thus, by using the outputs of only two ports of a four-port junction, one has all the information necessary in order to estimate the complex reflection coefficient of the device under test at each test frequency.

The uniqueness of the processing solution is that it was not immediately obvious that one could apply a constraint across frequency on the real and imaginary component of the complex reflection coefficient in order to remove the ambiguity at each frequency as to which potential solution was the correct solution. The subject system, instead of estimating the complex reflection coefficient directly at each frequency, computes the entire complex reflection coefficient profile at each test frequency all at once by applying the constraint that the real and imaginary component frequency profile only differ by a 90° phase shift. Again, this constraint is employed using the Hilbert Transform as described in Equation 0.01.

Figure 6:
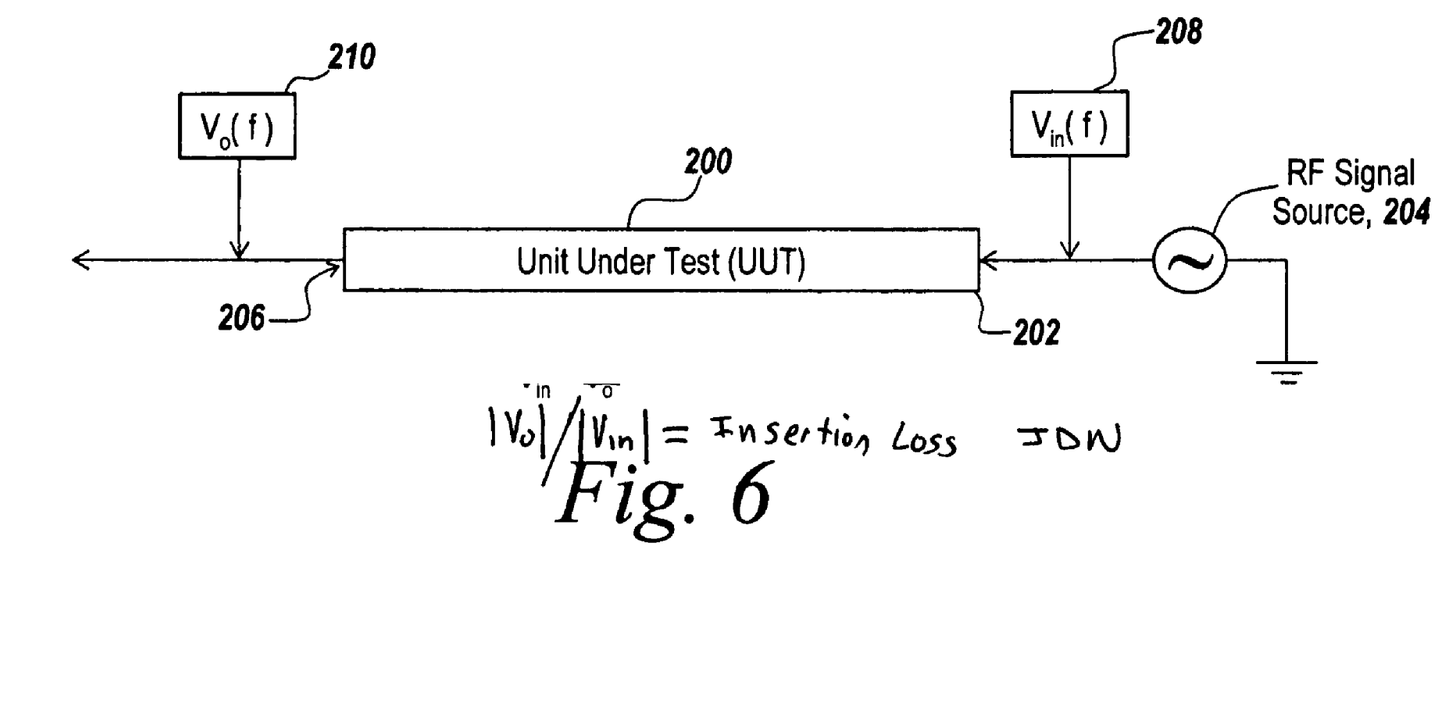
FIG. 6 is a diagrammatic illustration of the of the measurement of insertion loss for a circuit under test such as a transmission line; and, FIG. 7 is a diagrammatic illustration of how the subject reflectometer can be used to measure insertion loss.

Referring now to FIG. 6, in addition to determining distance to faults and the severity thereof, it is common that in a cable test scenario, a unit under test, UUT, 200 is provided with a voltage, $V_{in}$, 202 which is a function of frequency, $V_{in}(f)$. This sinusoidal voltage is provided by an RF signal source 204, with the resultant signal at output end 206 of the unit under test having associated with it $V_o(f)$ is used to calculate the insertion loss due to the unit under test, which is usually a transmission line.

$$\frac{|V_o|}{|V_{in}|}$$

is thus defined to be the insertion loss, with $V_{in}$ being a known value set by the RF signal source 204 and $V_o$ determined by a detector 210.

In normal operation one first tests for insertion loss with a separate unit and then tests for faults and the severity of the faults, using a completely separate unit.

Figure 7:
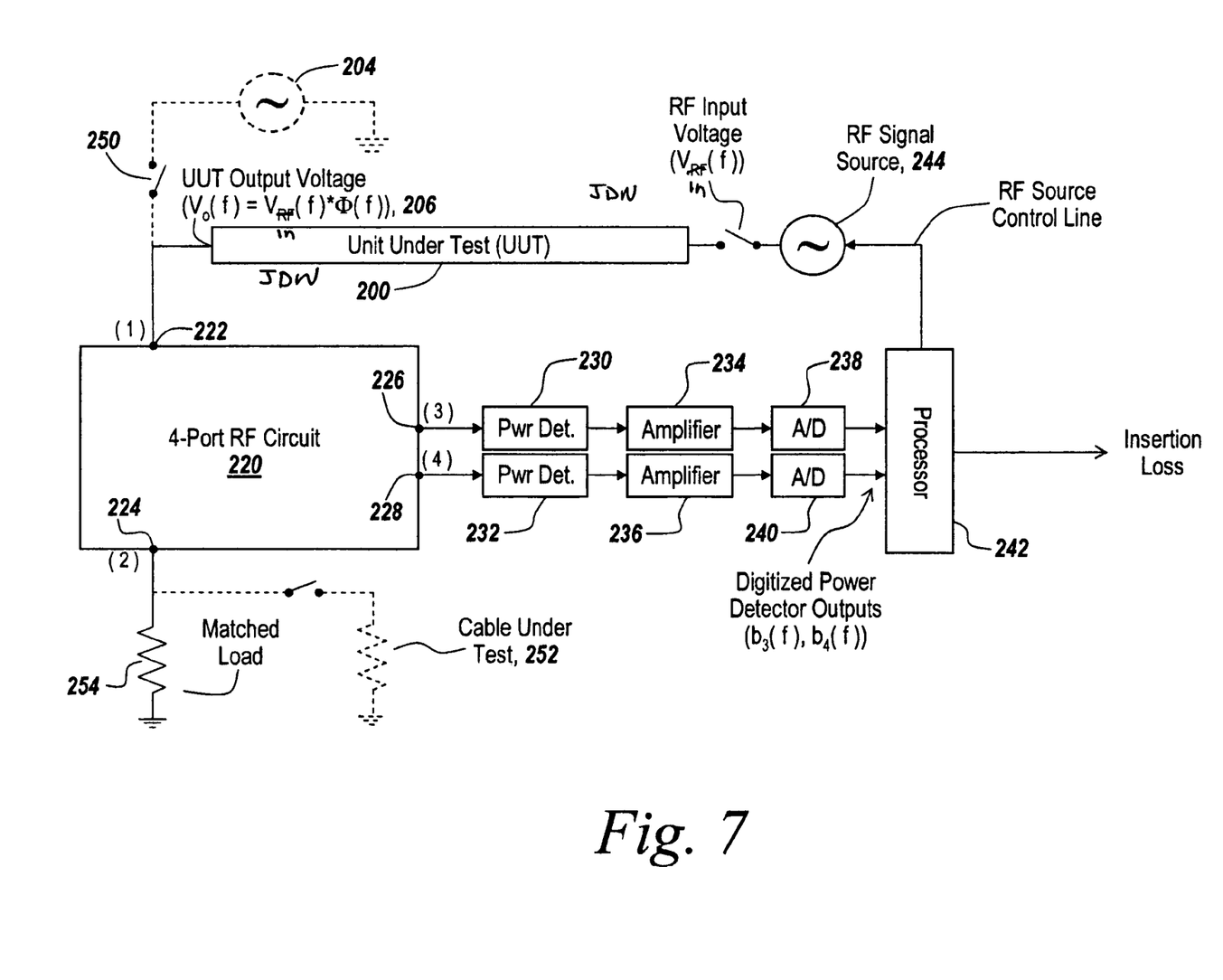

As shown in FIG. 7, the subject frequency domain reflectometer can be used both to sense distance to fault and the severity thereof, and also to test a unit under test for insertion loss by simply altering the algorithm it uses and changing what is attached to its signal and test ports. How this is done is as follows.

One provides a four-port RF circuit or junction 220 which has a signal port 222, a test port 224 and output ports 226 and 228. As before, these output ports are coupled to respective power detectors 230 and 232, and thence to amplifiers 234 and 236 respectively. The outputs of the amplifiers are respectively coupled to analog-to-digital converters 238 and 240, which are in turn coupled to a processor 242. The processor controls an RF signal source 244, which couples the aforementioned RF input voltage to the unit under test.

As shown in dotted outline, when using the reflectometer in an insertion loss meter, signal source 204 is disconnected from port 222 via a switch 250 to permit the coupling of end 206 of unit under test 200 to the four-port circuit or junction.

Likewise, a port 224, which is the test port, rather than being connected to a cable under test as illustrated at 252, is connected to a matched load 254 as illustrated.

Using the processing algorithm described below, the reflectometer that is used to detect distance to fault and the severity of the fault can have its test and signal ports connected to other elements so that the selfsame unit can be used to conduct an insertion loss test.

More particularly, an RF source power level, start frequency, stop frequency and frequency step size are selected for the test. This is operator defined and is usually based on the characteristics of the UUT. For example it might be desired to run a test from 6 GHz to 7 GHz with a step size of 0.25 MHz and setting the RF signal source to output 10 dBm.

Once these parameters are defined and the test is initiated the processor starts by setting the RF signal source to the start frequency, in this case 6 GHz. The RF signal source transmits a sinusoid at 6 GHz with a power of 10 dBm. This signal propagates through the UUT with a transfer function defined as $\Phi(f)$ and enters port 222 of the 4-port RF circuit and is coupled to the output of test port 224. This test port is connected to a matched termination and therefore no signal in reflected back into the probe from test port 224. The input signal from port 222 is also coupled to the output of ports 226 and 228. The amplitude and phase of the output signal from these ports is a function of the design of the 4-port RF circuit. The details of the 4-port RF circuit are described in the previous section. The power of each signal out of port 226 and 228 is measured by respective power detectors, is amplified and is digitized by respective analog-to-digital (A/D) converters 238 and 250. Because the RF source power is constant for a given frequency, the output signal from the each power detector will be a DC value.

To minimize the affects of noise induced by the power detector and amplifier circuitry each A/D circuit samples the DC signal multiple times and stores each measurement. For each port respectively, these samples are averaged. This averaging reduces the affect of all the noise sources after the power detectors. Also, one assumes that an anti-aliasing low pass filter is applied to the signal prior to being sampled by the A/D.

For each port, the averaged measurement is stored in processor memory. These averages measurements are denoted as $b_n(f)$ in FIG. 2, where n is the port index (3 or 4) and f is the frequency of the RF source for each measurement. Once this is complete, the processor sets the RF signal source to step to the next frequency, in this example 6.00025 GHz, and the entire measurement process is repeated. This measurement collect processes continues until the measurements for the stop frequency are measured, in this example 7 GHz.

After the measurement process is complete, the processor feeds the averaged measurements to a set of signal processing algorithms where the insertion loss $|\Phi(f)|$ of the UUT is estimated.

The method for estimating the insertion loss $|\Phi(f)|$ of the UUT using the 4-port reflectometer is described as follows:

First one defines a mathematical model of the measurements from each output port as a function of the UUT insertion loss and the circuit parameters. This can take on two forms, depending on whether the power detectors are square law or log detectors.

For square law power detectors the model is defined as:

$$b_n(f)=g_n(f)\cdot\delta_n(f)|\Phi(f)|^2+a_n(f)+w_n(f) \quad (0.13)$$

For log power detectors the model is defined as:

$$b_n(f)=g_n(f)\cdot\mathrm{LOG}_{10}(\delta_n(f)|\Phi(f)|^2)+a_n(f)+w_n(f) \quad (0.14)$$

Here $|\Phi(f)|$ is the insertion loss of the UUT and the parameters $\delta_n(f)$, $a_n(f)$ and $\delta_n(f)$ are the same parameters defined above. In this case the inputs to the estimator are these calibration parameters and the measurements $b_n(f)$ for each frequency and each port. To estimate the insertion loss the process is a follows:

If square law detectors are employed the insertion loss can be computed by finding the linear least squares estimate for $|\Phi(f)|^2$ and then taking the square root as defined in the following equation.

$$|\Phi(f)|=\sqrt{\arg\min\left\{\sum_{n=3}^{4}|b_n(f)-(g_n(f)\cdot\delta_n(f)|\Phi(f)|^2+a_n(f))|^2\right\}} \quad (0.15)$$

If log detectors are used one could use any number of optimization methods to minimize the square error between the measurements and the model as defined in the following equation.

$$|\Phi(f)|= \quad (0.16)$$

$$\sqrt{\arg\min\left\{\sum_{n=3}^{4}|b_n(f)-(g_n(f)\cdot\mathrm{LOG}_{10}(\delta_n(f)|\Phi(f)|^2)+a_n(f))|^2\right\}}$$

A Newton search algorithm or a gradient decent algorithm are two methods that could be used to calculate the insertion loss that minimizes the function in 0.16. One specific approach that is not computationally complex would be to first remove the affect of the gain, offset and logarithm terms as follows:

$$x_n(f) = 10^{\left(\left(\frac{b_n(f) - a_n(f)}{g_n(f)}\right)\right)} \qquad (0.17)$$

Then one computes the linear least squares estimate for $|\Phi(f)|^2$ given $x_n(f)$ and $\delta_n(f)$ and then takes the square root.

While the present invention has been described in connection with the preferred embodiments of the various figures, it is to be understood that other similar embodiments may be used or modifications or additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A reflectometer adapted to be connected to a signal source for generating test frequencies and a transmission line, comprising:
   a four-port junction having one input port adapted to be coupled to said signal source, a test port coupled to said transmission line and two output ports; and,
   a processor including an Inverse Fourier Transform coupled to said two output ports for calculating the distance to a fault in said transmission line and the severity thereof, said processor including a module for estimating a complex reflection coefficient frequency profile based on the signals at the outputs of said four-port junction, said complex reflection coefficient profile being coupled to said Inverse Fourier Transform.

2. The reflectometer of claim 1, wherein said four-port junction includes only two passive components.

3. The reflectometer of claim 2, wherein said two passive components include 90° quadrature hybrids.

4. The reflectometer of claim 3, wherein the output power signals at said output ports are 180° out of phase.

5. The reflectometer of claim 1, wherein said four-port junction includes two 90° quadrature hybrid components and a power splitter.

6. The reflectometer of claim 5, wherein one of said output ports carries only reflected energy.

7. The reflectometer of claim 1, wherein said four-port junction includes four 90° quadrature hybrid components and a power splitter.

8. The reflectometer of claim 7, wherein the output power signals at said output ports are 90° out of phase.

9. A reflectometer adapted to be connected to a signal source for generating test frequencies and a transmission line, comprising:
   a four-port junction having one input port adapted to be coupled to said signal source, a test port coupled to said transmission line and two output ports;
   a processor including an Inverse Fourier Transform coupled to said two output ports for calculating the distance to a fault in said transmission line and the severity thereof; and,
   power detectors respectively at different ones of said output ports and analog-to-digital converters coupled to respective power detectors, said processor
   1) combining the outputs of said analog-to-digital converters to form a single data point for each test frequency that represents the sum of the real and imaginary components of the complex reflection coefficient scaled by the effects of the four-port response and signal source power, and
   2) processing said data points with a Hubert Transform which outputs the complex reflection coefficient frequency profile scaled by a complex gain at each test frequency that is a function of the four-port junction response and the signal source power.

10. The reflectometer of claim 9, wherein said processor removes the complex gain effect by dividing the result at each frequency with the known complex gain for the four-port junction at each frequency.

11. The reflectometer of claim 10, wherein said known complex gain for said four-port junction at each frequency is determined in a calibration process.

12. The reflectometer of claim 10, wherein said complex reflection coefficient profile has a valid constraint that said real and imaginary components vary across frequency only by a 90° phase shift as a result of the use of the Hilbert Transform.

13. A frequency domain reflectometer, comprising:
   a four-port junction having a signal port, a test port and two output ports;
   a signal generator coupled to said signal port for supplying a signal of a predetermined frequency to said signal port, said signal generator coupled to one end of said transmission line, the other end of said transmission line coupled to said signal port, and said test port being coupled to a matched load, said processor configured to calculate insertion loss of said transmission line;
   a transmission line under test coupled to said test port;
   an estimator coupled to said output ports for estimating the frequency domain complex reflection coefficient of said transmission line under test;
   an Inverse Fourier Transform for transforming the frequency domain complex reflection coefficient into a time domain signal; and,
   a processor coupled to said time domain signal for determining the distance to a fault in said transmission line.

* * * * *